United States Patent
Yi et al.

(10) Patent No.: US 8,971,091 B2
(45) Date of Patent: Mar. 3, 2015

(54) METHOD AND CIRCUIT FOR SWITCHING A MEMRISTIVE DEVICE IN AN ARRAY

(75) Inventors: Wei Yi, Mountain View, CA (US); Muhammad Shakeel Qureshi, Santa Clara, CA (US); Frederick Perner, Santa Barbara, CA (US); Richard Carter, Los Altos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/884,140

(22) PCT Filed: Jan. 31, 2011

(86) PCT No.: PCT/US2011/023252
§ 371 (c)(1),
(2), (4) Date: May 8, 2013

(87) PCT Pub. No.: WO2012/067661
PCT Pub. Date: May 24, 2012

(65) Prior Publication Data
US 2013/0223134 A1  Aug. 29, 2013

Related U.S. Application Data

(60) Provisional application No. 61/415,524, filed on Nov. 19, 2010.

(51) Int. Cl.
*G11C 11/00*  (2006.01)
*G11C 13/00*  (2006.01)
*H01L 27/10*  (2006.01)

(52) U.S. Cl.
CPC ........ *G11C 13/0069* (2013.01); *G11C 13/0007* (2013.01); *H01L 27/101* (2013.01);
(Continued)

(58) Field of Classification Search
CPC .... G11C 11/00; G11C 13/00; G11C 2213/81; G11C 13/0002; G11C 13/0061; G11C 2013/0045; G11C 2013/0092; G11C 2213/71; G11C 2213/75; G11C 27/02
USPC .............. 365/148, 63, 130, 158, 171, 185.09, 365/225, 69
See application file for complete search history.

(56) References Cited

U.S. PATENT DOCUMENTS 5,889,702 A * 3/1999 Gaultier et al. ............ 365/185.2
6,856,555 B2 * 2/2005 Fujimoto ................. 365/189.07
(Continued)

OTHER PUBLICATIONS

PCT Search Report, Nov. 28, 2011, PCT Application No. PCT/US2011/023252.

*Primary Examiner* — Thong Q Le
(74) *Attorney, Agent, or Firm* — Van Cott, Bagley, Cornwall & McCarthy PC; Steven L. Nichols

(57) ABSTRACT

A method of switching a memristive device in a two-dimensional array senses a leakage current through the two-dimensional array when a voltage of half of a switching voltage is applied to a row line of the memristive device. A leakage compensation current is generated according to the sensed leakage current, and a switching current ramp is also generated. The leakage compensation current and the switching current ramp are combined to form a combined switching current, which is applied to the row line of the memristive device. When a resistance of the memristive device reaches a target value, the combined switching current is removed from the row line.

20 Claims, 7 Drawing Sheets

(52) U.S. Cl.
CPC   *G11C2013/0066* (2013.01); *G11C 2013/0078* (2013.01); *G11C 2213/32* (2013.01); *G11C 2213/55* (2013.01); *G11C 2213/77* (2013.01); *G11C 2213/81* (2013.01)
USPC .......... 365/148; 365/63; 365/130; 365/158; 365/185.09; 365/225

(56) References Cited

U.S. PATENT DOCUMENTS

| | | |
|---|---|---|
| 7,280,390 B2 | 10/2007 | Kostylev et al. |
| 7,436,723 B2 | 10/2008 | Rinerson et al. |
| 7,505,347 B2 | 3/2009 | Rinerson et al. |
| 7,876,607 B2 | 1/2011 | Tang |
| 2004/0160808 A1* | 8/2004 | Rinerson et al. .............. 365/158 |
| 2005/0036354 A1* | 2/2005 | Iwata ............................ 365/123 |
| 2005/0195647 A1* | 9/2005 | Perner ........................... 365/158 |
| 2005/0207234 A1* | 9/2005 | Baechtold et al. ....... 365/189.05 |
| 2005/0219914 A1* | 10/2005 | Sarin et al. ................ 365/189.01 |
| 2006/0023495 A1* | 2/2006 | Rinerson et al. .............. 365/158 |
| 2006/0044878 A1* | 3/2006 | Perner ...................... 365/189.01 |
| 2006/0181915 A1* | 8/2006 | Oh et al. ........................ 365/148 |
| 2007/0285990 A1 | 12/2007 | Lee |
| 2008/0090337 A1* | 4/2008 | Williams ....................... 438/133 |
| 2008/0159046 A1* | 7/2008 | Rinerson et al. .............. 365/226 |
| 2008/0170442 A1 | 7/2008 | Bedarida et al. |
| 2010/0073990 A1* | 3/2010 | Siau et al. ..................... 365/148 |
| 2010/0142254 A1* | 6/2010 | Choi et al. .................... 365/148 |
| 2010/0149856 A1 | 6/2010 | Tang |
| 2011/0007554 A1* | 1/2011 | Kaeriyama et al. ........... 365/148 |
| 2011/0026354 A1* | 2/2011 | Lin et al. ....................... 365/226 |
| 2011/0080763 A1* | 4/2011 | Siau et al. ....................... 365/51 |
| 2011/0182109 A1* | 7/2011 | Ikeda et al. ................... 365/148 |
| 2012/0087169 A1* | 4/2012 | Kuo et al. ........................ 365/72 |
| 2012/0091420 A1* | 4/2012 | Kusai et al. ...................... 257/4 |
| 2012/0113706 A1* | 5/2012 | Williams et al. .............. 365/148 |
| 2012/0243294 A1* | 9/2012 | Kaneko et al. ................ 365/148 |
| 2012/0314477 A1* | 12/2012 | Siau ............................... 365/148 |

* cited by examiner

METHOD AND CIRCUIT FOR SWITCHING A MEMRISTIVE DEVICE IN AN ARRAY

CROSS-REFERENCE TO RELATED APPLICATION

This application is a U.S. National Stage Application of and claims priority to International Patent Application No. PCT/US2011/023252, filed on Jan. 31, 2011, and entitled "METHOD AND CIRCUIT FOR SWITCHING A MEMRISTIVE DEVICE IN AN ARRAY," which claims priority to Provisional U.S. Patent Application No. 61/415,524, filed on Nov. 19, 2010 and entitled "ADAPTIVE CLOSED-LOOP CURRENT WRITE SCHEME FOR MEMRISTOR NANO-CROSSBAR ARRAY."

STATEMENT REGARDING FEDERALLY SPONSORED RESEARCH OR DEVELOPMENT

This invention has been made with government support under Contract No. HR0011-09-3-0001, awarded by Defense Advanced Research Projects Agency. The government has certain rights in the invention.

BACKGROUND

Memristive devices, or memristors, are a new type of switchable devices with an electrically switchable device resistance. Memristive devices are both scientifically and technically interesting, and hold promise for non-volatile memory (NVM) and other fields. For NVM applications, many memristive devices can be formed in a two-dimensional array, such as a crossbar structure, to provide a very high storage capacity. Nevertheless, it has been a major challenge to switch a selected memristive device within a crossbar structure reliably to desired states, due to the large leakage current through other memristive devices in the array that are connected to the same row or column line of the device being switched.

DETAILED DESCRIPTION

The following description provides a method of switching a bipolar memristive device in a two-dimensional crossbar array, and the associated control circuitry for such switching. As used herein, a memristive device is a switching device with its resistance representing its switching state, and the resistance depends on the history of the voltage and current applied to the device. The term "bipolar" means that the device can be switched from a low-resistance state ("LRS") to a high-resistance state ("HRS") by applying a switching voltage of one polarity, and from a high-resistance state to a low-resistance state by applying a switching voltage of the opposite polarity.

Figure 1:
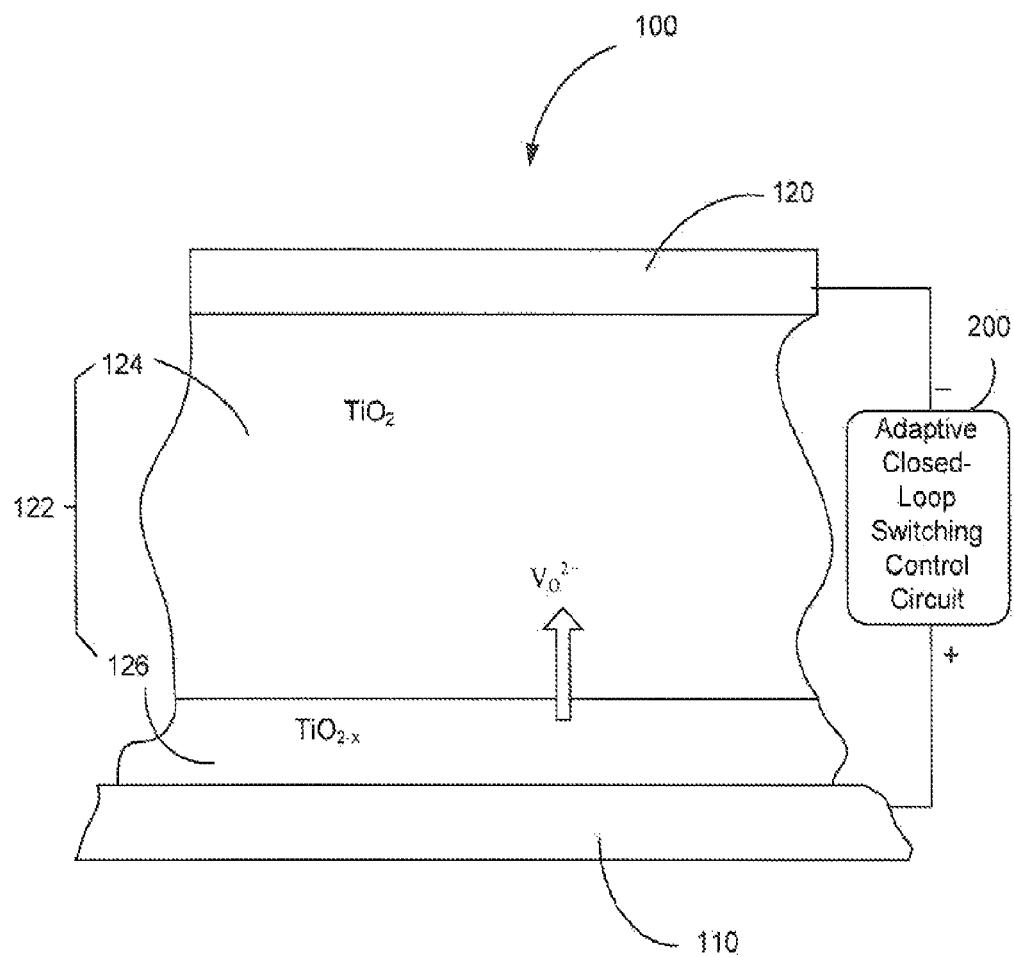
FIG. 1 is a schematic cross-sectional view of an example of a memristive device.
Figure 2:
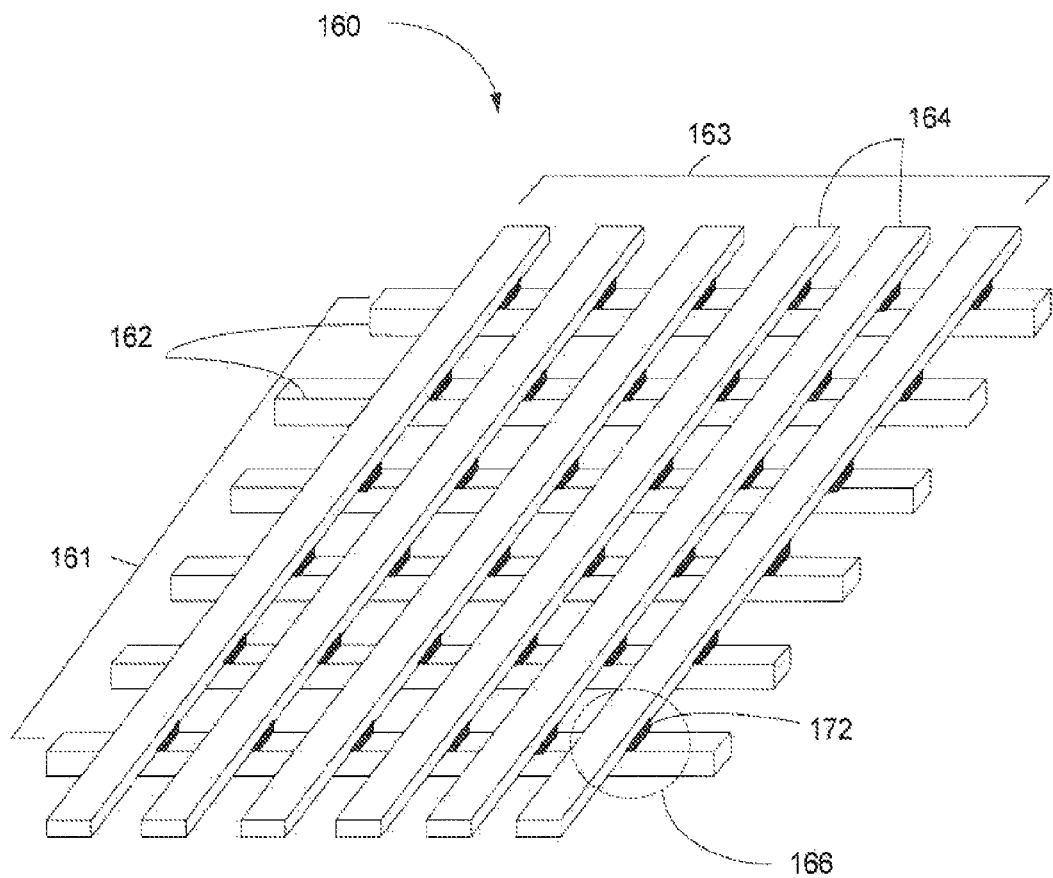
FIG. 2 is a schematic view of a crossbar structure containing multiple memristive devices.

FIG. 1 shows, in a schematic form, an example of a bipolar memristive device 100. In the embodiment shown in FIG. 1, the memristive device is a two-terminal device, with a top electrode 120 and a bottom electrode 110. An active region 122, where the switching behavior takes place, is disposed between the two electrodes. The active region 122 of the switching device 100 includes a switching material that may be electronically semiconducting or nominally insulating, as well as a weak ionic conductor. The switching material contains dopants that may be driven under a sufficiently strong electric field to drift through the switching material, resulting in changes in the resistance of the memristive device. The memristive device 100 can be used, for example, as a non-volatile memory cell, for storing digital information. Such a memory cell may be incorporated into a crossbar structure to provide a high storage capacity, as illustrated in FIG. 2.

Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

By way of example, as shown in FIG. 1, in one embodiment the switching material may be $TiO_2$. In this case, the dopants that may be carried by and transported through the switching material are oxygen vacancies ($V_O^{2+}$). The nanoscale switching device 100 can be switched between ON and OFF states by controlling the concentration and distribution of the oxygen vacancies in the switching material in the active region 122. When a DC switching voltage is applied across the top and bottom electrodes 120 and 110, an electric field is created across the active region 122. The switching voltage and current may be supplied by a switching circuit 200 with closed-loop feedback control, as will be described in greater detail below. The electric field across the active region 122, if of a sufficient strength and proper polarity, may drive the oxygen vacancies to drift through the switching material towards the top electrode 120, thereby turning the device into an ON state.

If the polarity of the electric field is reversed, the dopants may drift in an opposite direction across the switching material and away from the top electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. The switching is bipolar in that voltages of opposite polarities are used to switch the device on and off. The state of the switching device 100 may be read by applying a read voltage to the bottom and top electrodes 110 and 120 to sense the resistance across these two electrodes. The read voltage is typically much lower than the threshold voltage required to induce drifting of the ionic dopants between the top and bottom electrodes, so that the read operation does not alter the resistance state of the switching device.

In the embodiment of FIG. 1, the active region 122 of the switching device has two sub-regions or layers: a primary region 124 and a secondary region 126. The primary region 124 is the main place where the switching behavior occurs. In the originally formed state of the device, the primary region 124 has a relatively low dopant concentration, while the secondary region 126 has a relatively high dopant level. The secondary region 126 functions as a dopant source/drain. During a switching operation, dopants may be driven from the secondary region 126 into the primary region 124, or from the primary region to the secondary region, to change the distribution of dopants in the primary region, thereby changing the conductivity across the primary region.

For instance, the primary region 124 may contain $TiO_2$ with initially very low oxygen deficiency (i.e., low oxygen vacancies), and the second region 126 may be formed with a titanium oxide material ($TiO_{2-x}$) that is stoichiometrically close to $TiO_2$ but with a high level of oxygen vacancies. The top electrode 120 may be formed of a metal, such as platinum (Pt), that does not react with the switching material. The bottom electrode may be formed of a different conductor, such as a mixture of Pt and Ti. The interface of the Pt top electrode 120 with the $TiO_2$ switching material in the primary region 124 generates a Schottky-type depletion region. The interface between the dopant-rich material in the secondary region 126 and the bottom electrode 110, in contrast, may form an Ohmic-type contact. Initially, with a low dopant level in the switching material of the primary region, the height and width of the Schottky-type barrier in the primary region 124 may be large, making it difficult for electrons to tunnel through. As a result, the device has a relatively high resistance. When a switching voltage to turn the device ON is applied, the oxygen vacancies may drift from the secondary region 126 into the primary region and towards the top electrode 120. The increased concentration of dopants in the primary region and/or altered distribution can significantly reduce the height or width of the Schotty-type barrier. As a result, electrons can tunnel through the interface much more easily, resulting in a significantly reduced overall resistance of the switching device.

Memristive switching devices may be formed into an array for various applications that benefit from having a high density of switching devices. FIG. 2 shows an example of a two-dimensional array 160 of memristive switching devices. The array 160 has a first group 161 of generally parallel nanowires 162 running in a first direction, and a second group 163 of generally parallel nanowires 164 running in a second direction at an angle, such as 90 degrees, from the first direction. One group of the nanowires may be labeled as the row lines, and the other group may be labeled as the column lines. The two layers of nanowires 162 and 164 form a two-dimensional lattice which is commonly referred to as a crossbar structure, with each nanowire 162 in the first layer intersecting a plurality of the nanowires 164 of the second layer, and vice versa. A memristive switching device 166 may be formed at each intersection of the nanowires 162 and 164. The switching device 166 has a nanowire of the second group 163 as its top electrode and a nanowire of the first group 161 as the bottom electrode, and an active region 172 containing a switching material between the two nanowires. Each memristive device 166 in the two-dimensional array can be uniquely addressed by selecting the row line and column line that form the electrodes of the memristive device.

It has been a major challenge to switch a memristive device within a crossbar structure to reliably set the device in a desired resistive state. Typically, to switch a memristive device in a two-dimensional array, the row line and column line of the memristive device to be switched are selected, and voltages are applied to the row line and column line such that a desired switching voltage is applied across the memristive device. There are, however, other memristive devices connected to either the selected row line or the selected column line, and those devices will experience a portion of the switching voltage. Those devices are referred to as "half-selected" devices, and they create leakage current paths during a switching operation.

Figure 3:
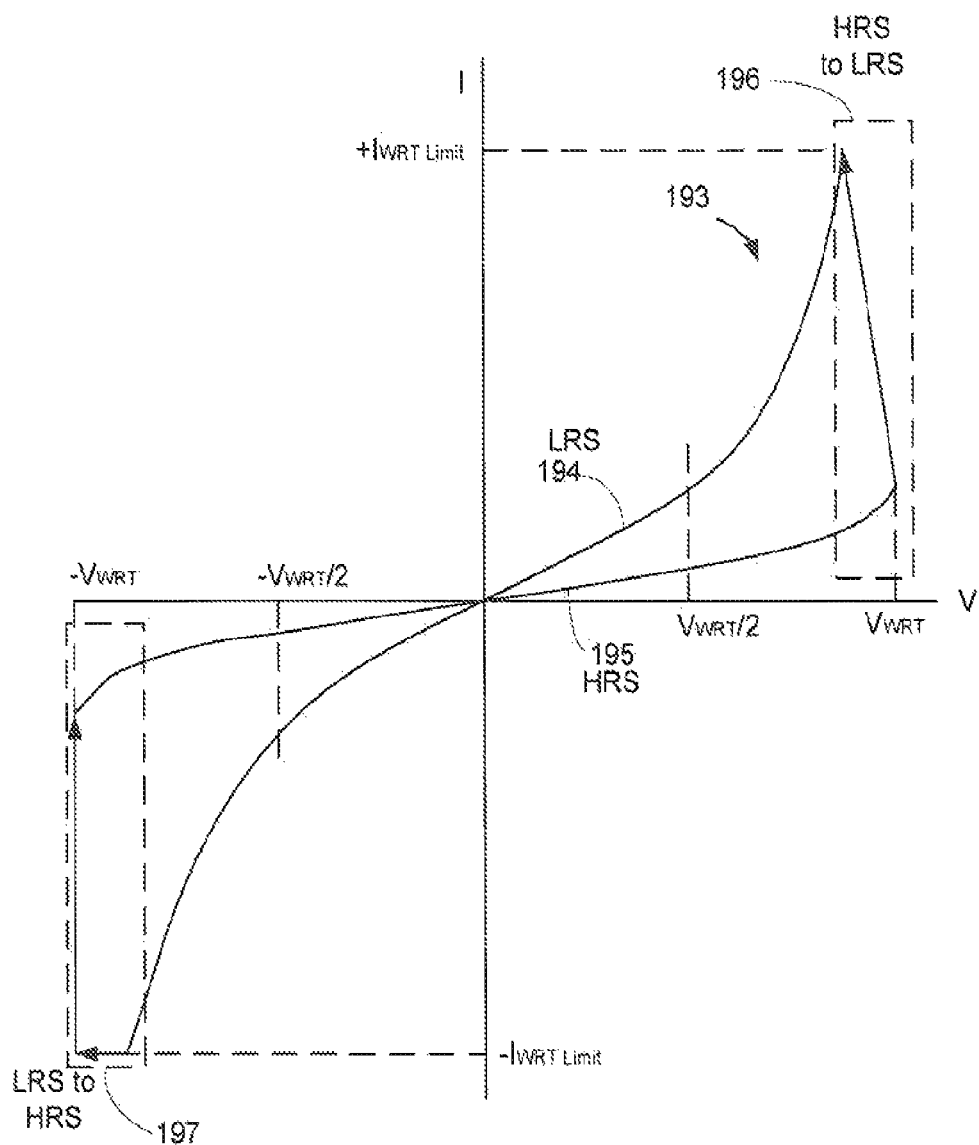
FIG. 3 is a schematic depiction of an I-V curve of a memristive device.

To illustrate this problem, FIG. 3 shows a schematic I-V curve 193 of a memristive device. The I-V curve has two segments: a segment 194 that corresponds to a low-resistance state (LRS), and a segment 195 high-resistance state (HRS). Each of the two resistive states is defined by the slope of the corresponding I-V curve segment at zero or low voltage biases, which represents the resistance of the device. The two segments are connected by two switching zones 196 and 197 to form a switching loop, with the device switched from the HRS state to the LRS state (ON-switching) in zone 196 and then back to the HRS state (OFF-switching) in zone 197. The present discussion is not restricted to the particular switching polarity illustrated in FIG. 3, since there are also cases that the ON-switching occurs at negative voltage and the OFF-switching occurs at positive voltage. The voltage Vwrt represents the voltage applied for switching the device on, and the voltage −Vwrt represents the voltage applied for switching the device off. At different switching polarities, the values of Vwrt and −Vwrt may or may not be the same. It can be seen that the device may conduct current even if the voltage across the device is less than Vwrt or −Vwrt. For instance, to control the leakage current experienced in switching a selected memristive device in a cross bar, the row line of the selected device may be set to Vwrt/2, and the column line of the selected device may be set to −Vwrt/2, so that the total voltage drop is Vwrt, while the unselected row and column lines are grounded. In that case, the half-selected devices, which are those unselected devices on the selected row and column, will see a voltage drop of Vwrt/2, and will conduct current accordingly. The leakage current through a half-selected device depends on if the device is in the LRS or HRS. If there are many memristive devices connected to each row or column, the leakage current can be very large compared to the switching current required to switch the selected device alone. In the past, the presence of a large and variable leakage current made it very difficult to reliably switch a selected device to an ON or OFF state, or a state in between the ON and OFF states.

Figure 4:
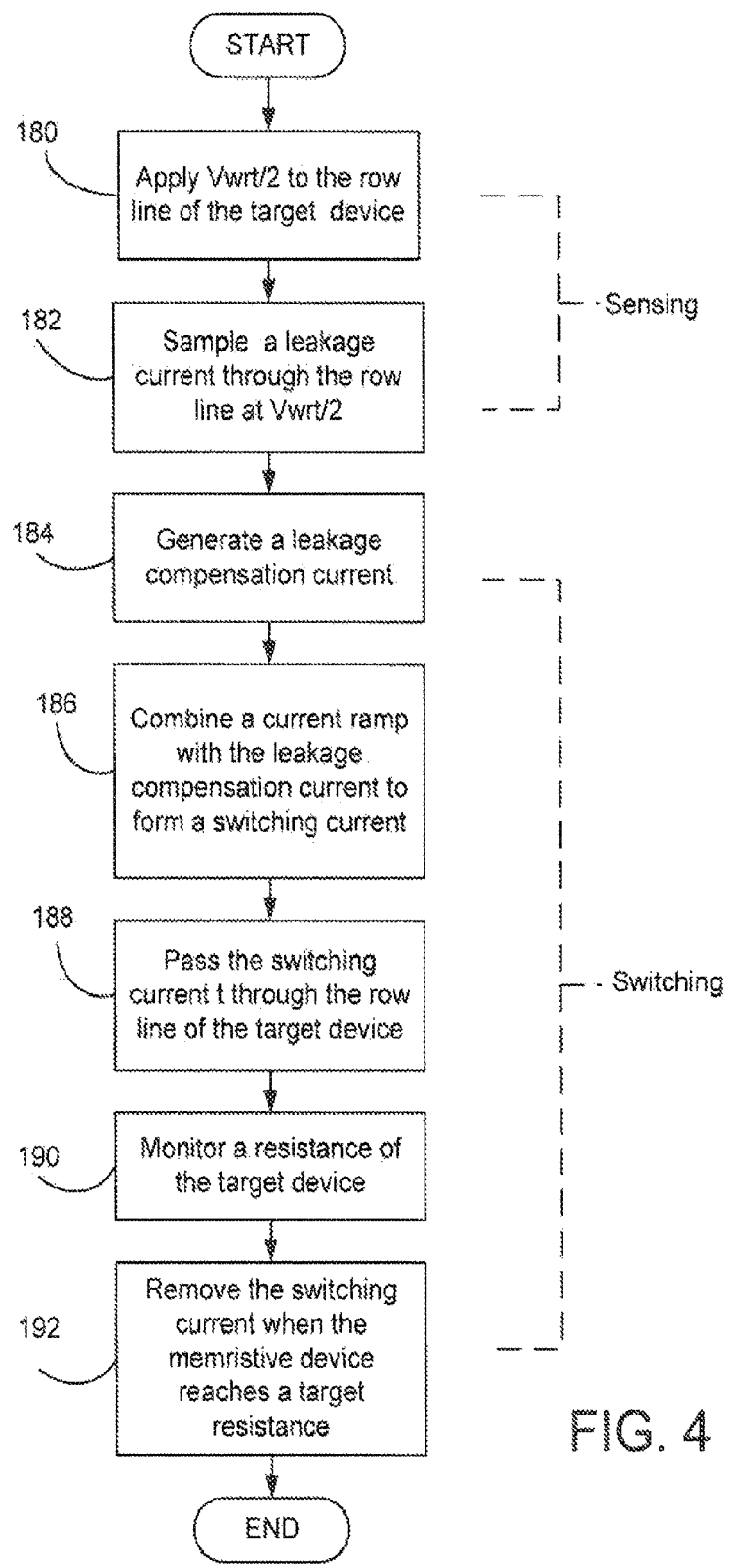
FIG. 4 is a flowchart showing a process of switching a memristive device in a two-dimensional array with adaptive closed-loop feedback control.

FIG. 4 shows a method in accordance with an embodiment of the invention that provides an effective way to address the problem of leakage current caused by "half-selection." As shown in FIG. 4, the method can be viewed as having two phases: a sensing phase and a switching phase. In the sensing phase, a voltage that is equal to half of the intended switching voltage Vwrt is applied to the row line of the memristive device to be switched ("the target device") (step 180). The leakage current caused by applying Vwrt/2 to the row line of the target device is sampled (step 182). In the switching phase, a leakage compensation current is generated (step 184). The magnitude of the leakage compensation current is the same as the sampled leakage current at Vwrt/2. The leakage compensation current is added to a switching current ramp intended for the selected memristive device to form a combined switching current (step 186). It should be noted that the leakage compensation current does not have to be added immediately and/or in its entirety at the onset of the switching current ramp, and the timing and rate of the addition may be adjusted by implementing appropriate circuitry. The combined switching current is passed through the row line of the target device (step 188). The resistance of the target device is monitored (step 190). When the resistance of the target device reaches a target value, the combined switching current is removed from the row line of the target device to terminate the switching operation (step 192). In the description above, the term "row line" is used only as a label to identify one of the electrode lines of the selected memristive device in the crossbar array, and is not intended to be tied to any particular physical orientation of the conductive lines of the crossbar array.

Figure 5:
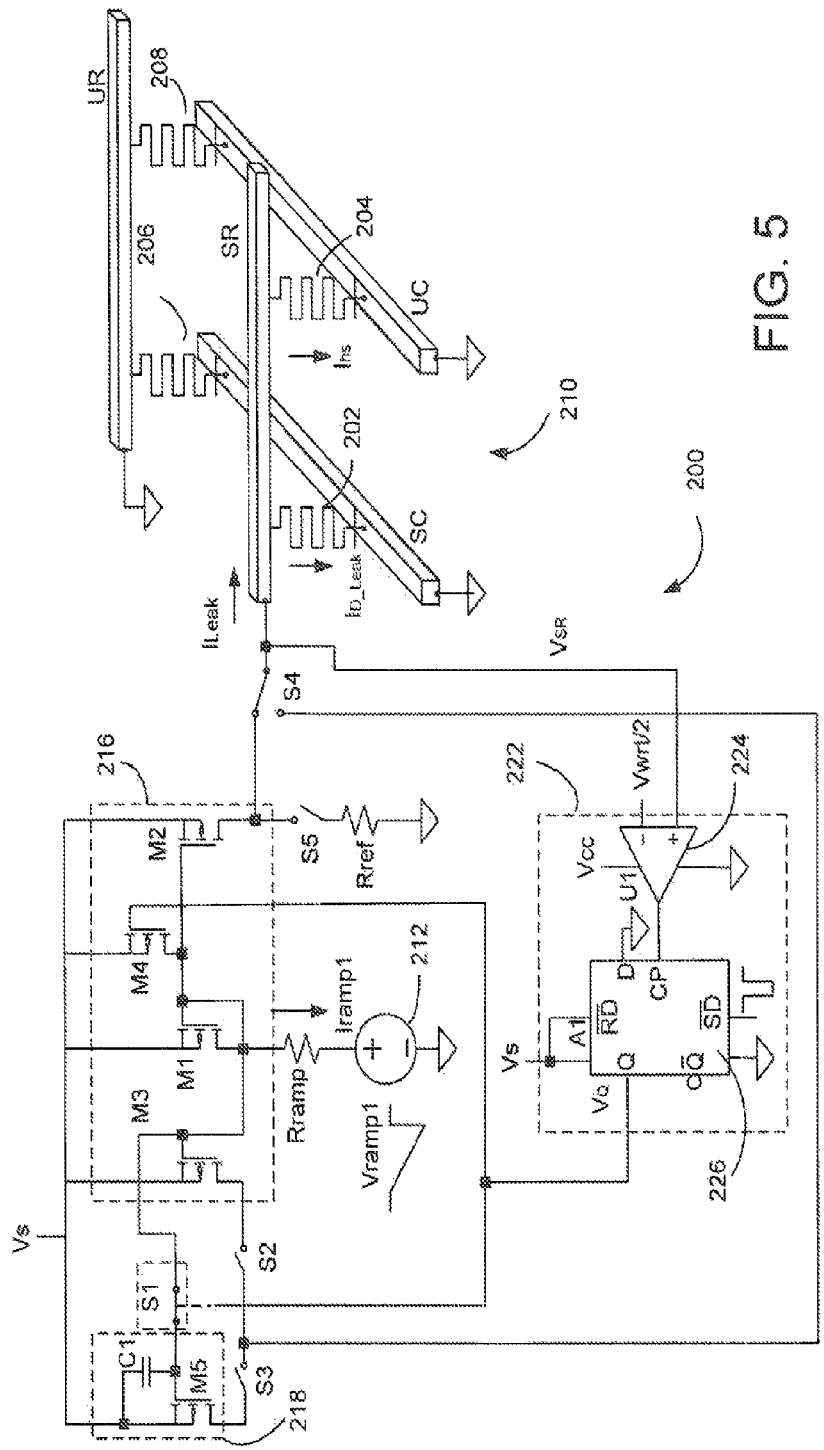
FIG. 5 is a schematic circuit diagram of an adaptive closed-loop switching control circuit in a sensing phase for sensing a leakage current prior to switching a selected memristive device in a two-dimensional array.
Figure 6:
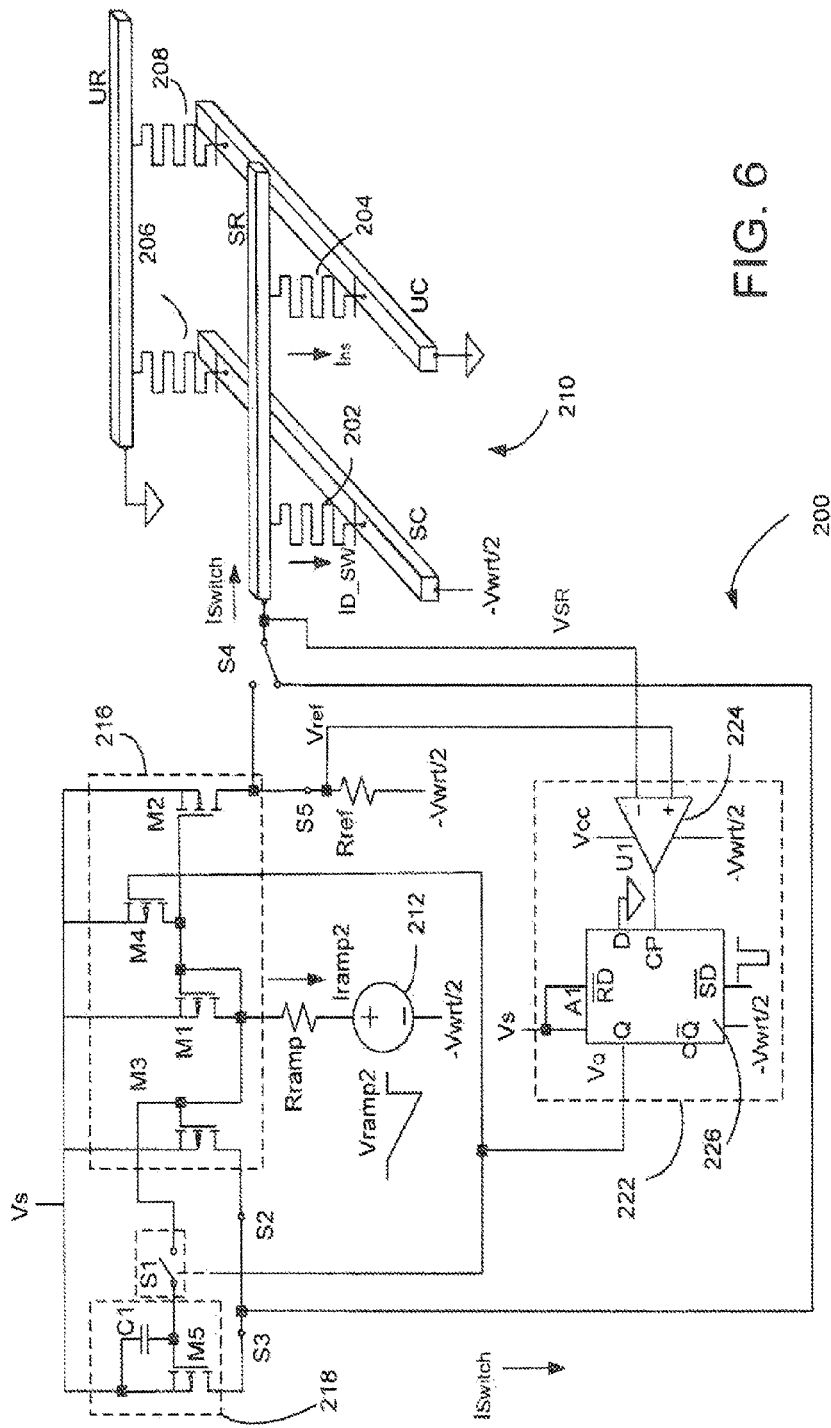
FIG. 6 is a schematic circuit diagram of the adaptive closed-loop switching control circuit in a switching phase for switching the selected memristive device with compensation for the leakage current.

FIGS. 5 and 6 show an embodiment of a control circuit 200 for implementing the adaptive closed-loop switching control described above, and FIG. 7 shows in a flowchart describing the switching control operation carried out using the control circuit. In FIGS. 5 and 6, the crossbar 210 is presented in a simplified form. The target device 202 (shown in electronic circuit symbol) to be switched is at the intersection of a selected row SR and a selected column SC. The unselected row UR in FIG. 5 represents all rows in the crossbar 210 other than the selected row SR, and the unselected column UC represents all columns of the crossbar 210 other than the selected column. The memristive device 206 represents all other memristive devices connected to the selected column SC, and the memristive device 204 represents all other memristive devices connected to the selected row SR. The memristive device 208 represents all memristive devices in the crossbar 210 that are not connected to either the selected column or the selected row.

FIG. 5 shows the configuration of the control circuit 200 when it is used in the leakage current sensing operation prior to switching the target memristive device 202 in the crossbar 210. The circuit 200 has a voltage source 212 for generating a voltage ramp $V_{ramp1}$. The voltage ramp is converted to a current ramp via a conversion resistor $R_{ramp}$ and a p-channel MOSFET (pMOS) transistor M1. The slope of the current ramp is a function of the value of $R_{ramp}$ and the slope of the voltage ramp. The transistor M1 is a master in a current mirror 216, which is a current driver component of the switching circuit. The current mirror 216 has duplicated current outputs, implemented with two slave pMOS transistors M2 and M3. The current flowing through the master transistor M1 is mirrored by the currents flowing through the slave transistors M2 and M3. The slave transistor M2 is either connected via a switch S4 to the row line SR of the selected memristive device 202, or connected via a switch S5 to a reference resistor $R_{ref}$. The other current mirror slave transistor M3 is connected to the row line SR via a switch S2 and also via the switch S4.

The control circuit 200 includes a leakage compensating component 218 for sampling the leakage current in the leakage current sensing phase of the switching operation, and generating a leakage compensation current in the switching phase. In the embodiment shown in FIG. 5, the leakage compensating component 218 includes a capacitor C1 and a transistor M5. The operation of the leakage compensating component 218 will be described in greater detail below. The control circuit 200 further includes a latched comparator 222, which in the embodiment is a combination of a high-speed differential-input voltage comparator 224 and an edge-triggered D flip-flop 226 which provides the latching function. Before the current ramp is initialized, a low-level signal at the set input ($\overline{SD}$) of the D flip-flop sets its output ($V_Q$) to high level regardless of the levels of the other inputs. The latched comparator 222 functions as a current removal controller for removing the current from the row line SR of the target device 202 under preset conditions.

Figure 7:
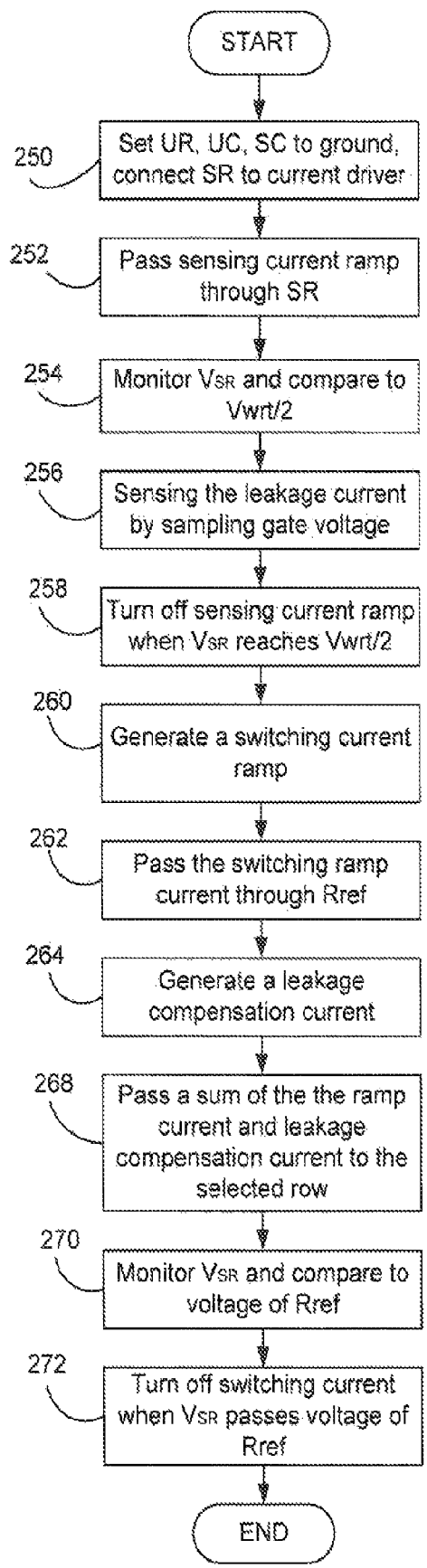
FIG. 7 is a flowchart showing a process implemented by the closed-loop switching control circuit for switching a selected memristive device in an array.

The leakage current sensing operation performed using the control circuit 200 is now described with reference to FIG. 7 and FIG. 5. First, all the row lines and column lines of the crossbar 210 except the selected row SR of the device to be switched are set to the ground level (step 250). The switch S4 is set to connect the selected row SR to the slave transistor M2 of the current mirror 216 (step 250), and the switch S5 is opened to disconnect the reference resistor $R_{ref}$ from the slave transistor M2. Thus, the current sourced by the slave driver M2 flows through the selected row SR. In the meantime, the switches S2 and S3 are open so the transistors M3 and M5 do not contribute to the current flowing to the selected row SR. The voltage source 212 generates a sensing voltage ramp $V_{ramp1}$, which is converted by the conversion resistor $R_{ramp}$ to a leakage-sensing current ramp $I_{ramp1}$. The current ramp is duplicated by the current mirror 216, such that a current of the same ramp form runs through the selected row SR (step 252). Because the selected column line SC of the target device 202 to be switched is at the ground level, the voltage across the device is not sufficient to switch the device, and the current flowing through the selected row SR is leakage current $I_{Leak}$, which is dominated by the half-select current $I_{hs}$ flowing through 204 (all the half-select devices on the selected row SR) plus a small current flowing through the target device 202 itself $I_{D\_Leal}$.

In the meantime, the switch S1, which is controlled by the output $V_Q$ of the latched comparator 222, is closed so that the gate voltage of the master transistor M1 (and also the gate voltage of the slave transistor M2) is connected to the gate of the transistor M5 of the leakage compensating component 218. In this regard, the switch S1 may be implemented as a latched switch so that it is toggled only by the falling edge of the control signal. The capacitor C1 is connected between the supply voltage Vs and the gate of the transistor M5. When the gate voltage changes, the capacitor C1 is charged accordingly. In this arrangement, the capacitor C1 serves the function of sampling and holding the gate voltage of the transistor M1, which controls the amount of current flowing through master transistor M1 as well as the leakage sensing current generated by the transistor M2.

As the sensing current ramps up, the voltage on the selected row SR increases. In the meantime, a voltage of Vwrt/2 is supplied as one input to the comparator 224, while the voltage $V_{SR}$ of the selected row SR is connected as another input to the comparator (step 254). When the voltage $V_{SR}$ reaches Vwrt/2, the differential input of the comparator 224 crosses zero to positive sign and trips the output of the comparator from logic low to logic high. The comparator output is connected via the D flip-flop 226 to the gate of a shunt transistor M4. The latch output $V_Q$ maintains that logic low and switches on the shunt transistor M4, which effectively bypasses the ramp current flowing through M1 and clamps the mirror transistor gate voltage back to Vs. Consequently, the pMOS current mirror output transistors M2 and M3 are switched off and the sensing current ramp through the selected row is terminated (step 258), even though $V_{ramp1}$ could be still rising.

During the sensing operation, the amount of leakage current passing through the selected row SR is monitored by using the leakage compensating component 218. As the gate voltage of the master transistor M1 changes during the current ramp, that voltage is sampled and held by means of the charging of the capacitor C1. When the output of the latched comparator 222 changes in response to the voltage $V_{SR}$ reaching Vwrt/2, it not only cuts off the sensing current ramp but also opens the switch S1. As a result, the voltage of the capacitor C1 is maintained at the value of the gate voltage of the transistor M1 at the moment the voltage of the selected row SR reaches Vwrt/2.

Turning now to FIG. 6, in the switching phase of the switching operation, the column line SC of the target device 202 being switched is set to −Vwrt/2, and the voltage reference for the driver circuit is also set to −Vwrt/2. Before the switching current is generated, a low-level signal at the set input ($\overline{SD}$) of the D flip-flop sets its output ($V_Q$) to a high level, which turns off the shunt transistor M4. The voltage source 212 generates a switching voltage ramp $V_{ramp2}$, which is converted by the conversion resistor $R_{ramp}$ into a switching current ramp $I_{ramp2}$ (step 260). The current ramp $I_{ramp2}$ is duplicated by the slave transistors M2, M3 of the current mirror 216. The switch S5 is closed so that the current ramp produced by the transistor M2 is passed through the reference resistor $R_{ref}$ (step 262). The lower end of the reference resistor $R_{ref}$ is also set to −Vwrt/2. The value of the reference resistor $R_{ref}$ is selected as a target value to which the resistance of the memristive device is to be set by the switching operation.

In the switching phase, the leakage compensating component 218 is used to provide a leakage compensation current that has the same magnitude as the leakage current at Vwrt/2 sampled in the sensing phase (step 264). At the beginning of the switching phase, the switch S1 remains open so there is no connection between the gates of M1 and M5. The voltage across the capacitor C1, which is set and held in the previous leakage current sensing phase, sets that gate voltage that controls the current output of the transistor M5. The transistors M1, M2 and M5 are chosen to have nearly identical I-V characteristics, so that the same gate voltage value will provide substantially the same current output from the transistors. As the capacitor C1 holds the gate voltage of the transistor M5 at the same gate voltage of M2 when M2 was passing the leakage current at $V_{SR}$=Vwrt/2, the current output of M5 has the same magnitude as that sensed leakage current. In the meantime, the slave transistor M3 of the current mirror also duplicates the switching current ramp. The switches S2 and S3 are closed, and the leakage compensation current provided by the transistor M5 and the duplicated switching current ramp provided by the slave transistor M3 are summed into a combined switching current $I_{Switch}$. The switch S4 is set to pass the switching current $I_{Switch}$ to the select row SR of the target device 202 in the array 210 (step 268). A portion of the combined switching current goes through the device 202 being switched, and the rest is leakage current through other devices in the crossbar.

The control circuit 200 uses the voltage $V_{SR}$ of the selected row SR as an indication of the resistive state of the target device 202. In this regard, the total voltage drop across the target device is $V_{SR}$+Vwrt/2, which equals the product of the current flowing through the target device and the resistance of the target device. The value of $V_{SR}$ is monitored by means of the latched comparator 222 (step 270), and $V_{SR}$ is connected to one input of the comparator 224, while the voltage at the upper end of the reference resistor $R_{ref}$ is connected to the other input of the comparator.

In the embodiment of FIG. 6, the memristive device 202 being switched is connected for an ON-switching operation. Initially, the target device 202 is in an OFF or high-resistance state, with a higher resistance than the reference resistor $R_{ref}$. The voltage $V_{SR}$ of the selected row SR is higher than the voltage $V_{ref}$ of the reference resistor $R_{ref}$. As the current through the selected row SR increases due to the current ramp, the voltage $V_{SR}$ increases. The voltage $V_{ref}$ of the reference resistor also increases due to the current ramp, but remains lower than the voltage $V_{SR}$ of the selected row SR. When $V_{SR}$ becomes close to Vwrt/2, the voltage drop across the target device 202 becomes close to the switching voltage Vwrt, and the device starts to switch. The total current $I_{Switch}$ going through the selected row SR is the sum of the current ramp $I_{ramp2}$ flowing through the target device 202 and the half-select leakage current $I_{hs}$ flowing through the other devices 204 in the array 210. At the same time, the same amount of ramp current $I_{ramp2}$ is flowing through the reference resistor $R_{ref}$.

As the target device 202 turns on, its resistance drops quickly, faster than the rate of the current ramp, and as a result the voltage $V_{SR}$ of the selected row SR starts to decrease quickly. When the resistance of the target device reaches the value of the reference resistor, $V_{SR}$ becomes the same as $V_{ref}$. As a result, the differential input of the comparator 210, $V_{ref}$-$V_{SR}$, crosses zero and trips the output of the comparator 224 from logic low to logic high. The output of the latched comparator 222 switches on the shunt transistor M4, which switches off the transistors M2 and M3, thereby terminating the current ramp on the selected row SR and the reference resistor $R_{ref}$. Also, the switch S1 is closed due to the change of the comparator output, so the transistor M5 is also turned off and the leakage compensation current is stopped. As a result, the switching current is removed from the selected row SR (step 272), and the target device is left with a resistance value that is close to the target value.

It should be noted that the design of an analog feedback circuit for switching a memristive device in an array is not exclusive and is not limited to the presented example in FIGS. 5 and 6. For example, the simple current mirror is not an ideal current source. To improve its characteristics such as output impedance or voltage swing range, more advanced current mirror variants can be applied, such as cascode, wide-swing cascode, or gainboosted current mirrors incorporating operational amplifiers. The expense of such advanced current mirrors is the extra footprint and power consumption. Also, the leakage compensating component 218 can be more complicated than the given example of just a capacitor C1 and a transistor M5. For those skilled in the art, more advanced CMOS circuit may be designed for improved performance in current sampling and regeneration.

In the description above, the control circuit 200 in FIGS. 5 and 6 is used to switch a memristive device in a crossbar from a high-resistance state (e.g., OFF) to a low-resistance state (e.g., ON). The circuit can similarly be used to switch a device from a low-resistance state to a high-resistance state. To that end, the current ramp is connected to the column rather than the row of the selected device, so that the direction of current flow through the target device is reversed as compared to that of the ON-switching operation. A different reference resistor value may be used as the target value for the OFF-switching operation. Also, the connections to the positive and negative input terminals of the comparator during the switching operation may also be reversed, due to that the selected device is being switched from a low-resistance state to a high-resistance state.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of switching a memristive device in a two-dimensional array, comprising:
sensing a leakage current through the two-dimensional array when a voltage of half of a switching voltage is applied to a row line of the memristive device;
generating a leakage compensation current according to the sensed leakage current;
generating a switching current ramp;
combining the leakage compensation current and the switching current ramp to form a combined switching current;
applying the combined switching current to the row line of the memristive device; and
removing the combined switching current from the row line of the memristive device when a resistance value of the memristive device reaches a target value.

2. A method as in claim 1, wherein the step of applying the combined switching current includes biasing a column line of the memristive device at negative half of the switching voltage.

3. A method as in claim 2, further including:
applying the switching current ramp to a reference resistor; and
comparing a voltage across the memristive device with a voltage across the reference resistor.

4. A method as in claim 3, wherein the step of comparing includes feeding the voltage across the memristive device and the voltage across the reference resistor to a latched comparator.

5. A method as in claim 3, wherein the step of applying the switching current ramp to the reference resistor includes duplicating the switching current ramp with a current mirror and feeding an output of the current mirror to the reference resistor.

6. A method as in claim 3, wherein the step of sensing the leakage current includes:
driving a first transistor to provide a sensing current ramp to the row line of the memristive device;
sampling a gate voltage of the first transistor when a voltage of the row line of the memristive device reaches half of the switching voltage.

7. A method as in claim 6, wherein the step of generating the leakage compensation current includes using the sampled gate voltage to control a second transistor to generate the leakage compensation current.

8. A method as in claim 1, wherein the switching current ramp is of a polarity for switching the memristive device from a high-resistance state to a low resistance state.

9. A switching circuit for switching a memristive device in a two-dimensional array, comprising:
a leakage compensation component connected to sample a leakage current through the two-dimensional array when a voltage of the row line reaches half of an intended switching voltage and to produce a leakage compensating current according to the sampled leakage current;
a current driver component for generating a switching current ramp, the leakage compensating component and the current driving component being connected to sum with the leakage compensation current and the switching current ramp into a combined switching current and to apply the combined switching current to the row line of the memristive device; and
a current removal controller for removing the switching current from the row line when a resistance of the memristive device reaches a target value.

10. A switching circuit as in claim 9, wherein the current driver component includes a current mirror for generating duplicates of the switching current ramp.

11. A switching circuit as in claim 10, further including a reference resistor, wherein the current mirror applies a first duplicated current ramp to the reference resistor, and provides a second duplicated current ramp to be summed with the leakage compensation current to form the combined switching current.

12. A switching circuit as in claim 11, wherein the current removal controller includes a comparator connected to compare a voltage across the memristive device and a voltage across the switching reference resistor during the switching current ramp.

13. A switching circuit as in claim 12, wherein the current removal controller includes a latched comparator.

14. A switching circuit as in claim 9, wherein the current driver component includes a current driver transistor connected for applying a sensing current to the row line of the memristive device, and wherein the leakage compensating component is connected to sample a gate voltage of the current driver transistor when the current driver transistor passes the sensing current through the row line at half of the intended switching voltage.

15. A switching circuit as in claim 14, wherein the leakage compensating circuit further includes a leakage compensating transistor connected for generating the leakage compensation current using the sampled gate voltage.

16. A method of switching a target memristive device in a two-dimensional array, comprising:
applying half of a switching voltage to a row line of the target memristive device;
sensing a leakage current through the two-dimensional array when half of the switching voltage is applied;
generating a leakage compensation current according to the sensed leakage current;
generating a switching current ramp;
combining the leakage compensation current and the switching current ramp to form a combined switching current; and
applying the combined switching current to the row line of the memristive device to switch a resistance state of the target memristive device.

17. A method as in claim 16, further including:
applying the switching current ramp to a reference resistor; and
comparing a voltage across the target memristive device with a voltage across the reference resistor.

18. A method as in claim 17, wherein applying the switching current ramp to the reference resistor includes duplicating the switching current ramp with a current mirror and feeding an output of the current mirror to the reference resistor.

19. A method as in claim 16, wherein sensing the leakage current includes:
driving a first transistor to provide a sensing current ramp to the row line of the target memristive device;
sampling a gate voltage of the first transistor when a voltage of the row line of the memristive device reaches half of the switching voltage.

20. A method as in claim 19, wherein generating the leakage compensation current includes using the sampled gate voltage to control a second transistor to generate the leakage compensation current.

* * * * *